(12) United States Patent
Lou

(10) Patent No.: US 6,251,735 B1
(45) Date of Patent: Jun. 26, 2001

(54) METHOD OF FORMING SHALLOW TRENCH ISOLATION STRUCTURE

(75) Inventor: Chine-Gie Lou, Hsinchu Hsien (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/448,018

(22) Filed: Nov. 23, 1999

(30) Foreign Application Priority Data

Oct. 29, 1999 (TW) ................................................. 88118757

(51) Int. Cl.$^7$ ........................... H01L 21/336; H01L 21/76
(52) U.S. Cl. ........................... 438/296; 438/404; 438/424; 438/435
(58) Field of Search ................................... 438/404, 296, 438/424, 435

(56) References Cited

U.S. PATENT DOCUMENTS 6,093,618 * 7/2000 Chen et al. .
6,140,208 * 10/2000 Agahi et al. .

\* cited by examiner

*Primary Examiner*—Richard Booth
*Assistant Examiner*—Josetta I. Jones
(74) *Attorney, Agent, or Firm*—Jiawei Huang; J.C. Patents

(57) ABSTRACT

A method of forming a shallow trench isolation (STI) structure. A dielectric layer is formed over the interior surface of a shallow trench. Spacers are formed on the sidewalls of the shallow trench such that a portion of the dielectric layer at the bottom of the shallow trench is exposed. When a silicon oxide layer is subsequently deposited into the shallow trench using ozone and tetra-ethyl-ortho-silicate as reactive gases in a chemical vapor deposition, the silicon oxide layer is deposited faster from the dielectric layer than from the spacers.

11 Claims, 3 Drawing Sheets

METHOD OF FORMING SHALLOW TRENCH ISOLATION STRUCTURE

CROSS-REFERENCE TO RELATED APPLICATION

This application claims the priority benefit of Taiwan application Ser. No. 88118757, filed Oct. 29, 1999.

BACKGROUND OF THE INVENTION

1. Field of the Invention

The present invention relates to a method of forming the device isolation structure of an integrated circuit (IC). More particularly, the present invention relates to a method of forming a shallow trench isolation (STI) structure.

2. Description of the Related Art

A complete integrated circuit usually consists of millions of metal-oxide-semiconductor (MOS) transistors. To prevent any two neighboring transistors from short-circuiting, some isolating structures need to be formed between transistors. Conventionally, a field oxide (FOX) layer is formed around transistors by local oxidation of silicon (LOCOS). However, due to many side effects related to the use of the field oxide layer such as internal stress and bird's beak encroachment problem, field oxide isolation has been gradually replaced by shallow trench isolation (STI) structures. In fact, as the critical dimensions (CDs) of devices continue to decrease, STI structures have become widely used in deep sub-micron fabrication process.

FIGS. 1A through 1C are schematic, cross-sectional views showing the steps for producing a conventional STI structure in a substrate.

As shown in FIG. 1A, a pad oxide layer 102 and a mask layer 104 are formed over a substrate 100 in sequence. The pad oxide layer 102 is formed by thermal oxidation. A shallow trench 106 is formed in the substrate 100 by a photolithographic and etching process. A liner oxide layer 108 is formed on the exposed substrate 100 inside the shallow trench 106 by thermal oxidation.

As shown in FIG. 1B, an oxide layer 110 that fills the shallow trench 106 is formed. The oxide layer 110 is formed by depositing oxide material into the shallow trench 106 and over the mask layer 104 to form an oxide layer (not shown in the figure). The oxide layer above the mask layer 104 is then removed by chemical-mechanical polishing. The oxide layer 110 is formed by using ozone (O3) and tetra-ethyl-ortho-silicate (TEOS) as reactive gases in a chemical vapor deposition (CVD).

As shown in FIG. 1C, the pad oxide layer 102 and the mask layer 104 are removed to form the STI structure. The pad oxide layer 102 and the mask layer 104 are removed by wet etching.

Because a shallow trench has a definite aspect ratio (AR), in other words, depth of the shallow trench is greater than its width, filling the shallow trench with oxide material become increasingly difficult as the critical dimensions of devices are reduced. This is especially serious when $O_3$ and TEOS are used as the reactive gas in a chemical vapor deposition to form the oxide layer in the shallow trench. Since the deposition rate of oxide on the bottom and the sides of the shallow trench are almost identical, after filling the shallow trench with oxide material, voids or seams are likely formed in the middle of all shallow trench structures with a definite aspect ratio.

SUMMARY OF THE INVENTION

The invention provides a method of forming an STI structure. A substrate is first provided. A pad oxide layer is formed over the substrate, and then a mask layer is formed over the pad oxide layer. Photolithographic and etching processes are used to form a shallow trench through the mask layer, the pad oxide layer and into the substrate. A liner oxide layer is formed on the exposed surface in the shallow trench interior. A first dielectric layer is formed over the mask layer and the liner oxide layer. A second dielectric layer is formed over the first dielectric layer. The second dielectric layer is etched back to form spacers on the sidewalls of the shallow trench while exposing a portion of the first dielectric layer at the bottom of the shallow trench. Using ozone and tetra-ethyl-ortho-silicate (TEOS) as reactive gases, a chemical vapor deposition is carried out to form a silicon oxide layer that fills the shallow trench and covers the first dielectric layer. The silicon oxide layer is deposited at a faster rate on the surface of the first dielectric layer than on the surface of the spacers. A planarization operation is next carried out to remove the silicon oxide layer and the first dielectric layer above the mask layer. Finally, the mask layer and the pad oxide layer are sequentially removed.

In this invention, a dielectric layer is formed over the interior surface of a shallow trench before forming spacers on the sidewalls of the shallow trench that expose a portion of the dielectric layer at the bottom of the shallow trench. Hence, subsequently a silicon oxide layer is deposited at a faster rate on the bottom surface of the shallow trench than on the side surface of the shallow trench. Therefore, for a shallow trench having a definite aspect ratio, the chemical vapor deposition process using ozone and TEOS as reactive gases is able to form a silicon oxide layer inside the shallow trench, which silicon oxide layer inside the shallow trench is free of voids or seams.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
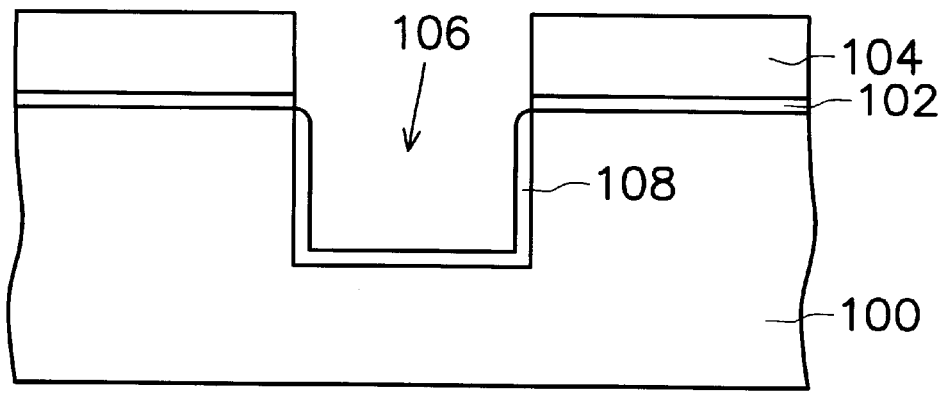
FIGS. 1A through 1C are schematic, cross-sectional views showing the steps for producing a conventional STI structure in a substrate.
Figure 1B:
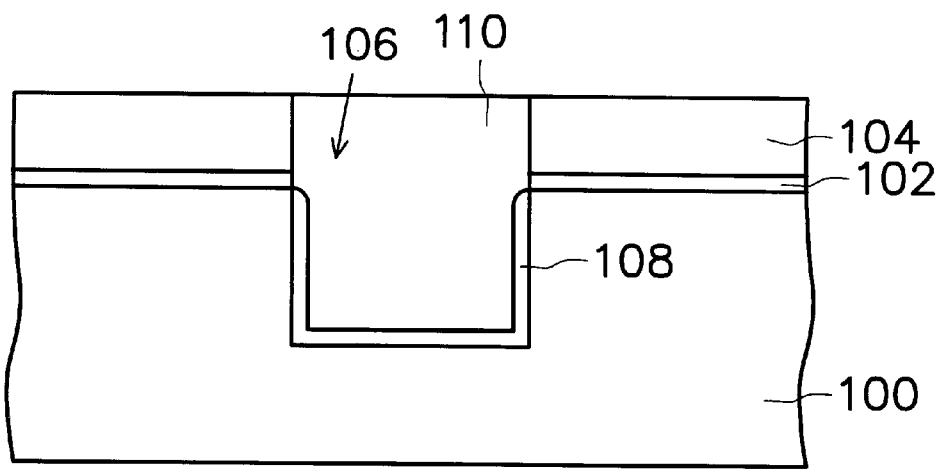
Figure 1C:
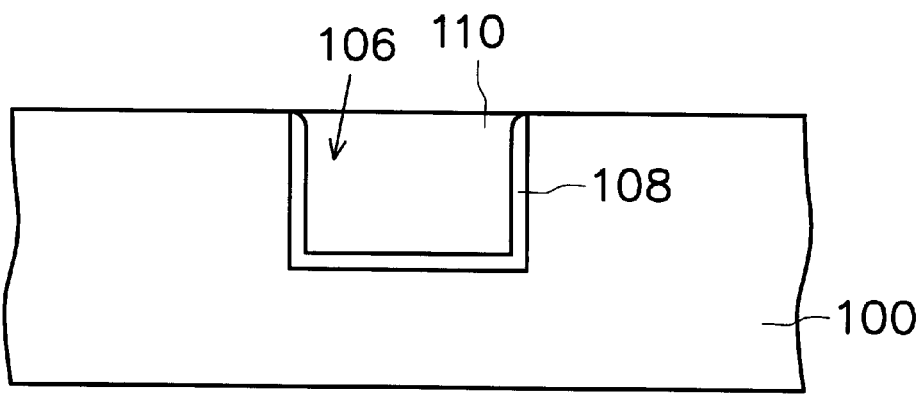

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic cross-sectional views showing the steps for producing an STI structure according to one preferred embodiment of this invention.

Figure 2A:
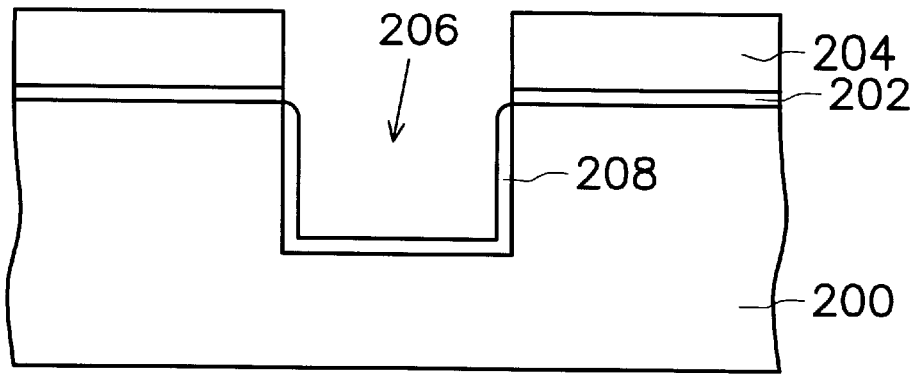
FIGS. 2A through 2E are schematic, cross-sectional views showing the steps for producing an STI structure according to one preferred embodiment of this invention.

As shown in FIG. 2A, a pad oxide layer 202 and a mask layer 204 are formed over a substrate 200 in sequence. A shallow trench 206 having a depth of between 3000 angstroms to 5000 angstroms is formed through the mask layer 204, the pad oxide layer 202 and into the substrate 200 by a photolithographic and etching process. The pad oxide layer 202, preferably having a thickness of between 100 angstroms to 300 angstroms, can be formed by, for example, thermal oxidation. The mask layer 204, preferably having a thickness of between 1500 angstroms to 2000 angstroms, can be a silicon nitride layer formed by, for example, chemical vapor deposition. A liner oxide layer 208 is formed on the exposed substrate surface inside the shallow trench 206. The liner oxide layer 208, preferably having a thickness of between 100 angstroms to 250 angstroms, is formed by, for example, thermal oxidation.

Figure 2B:
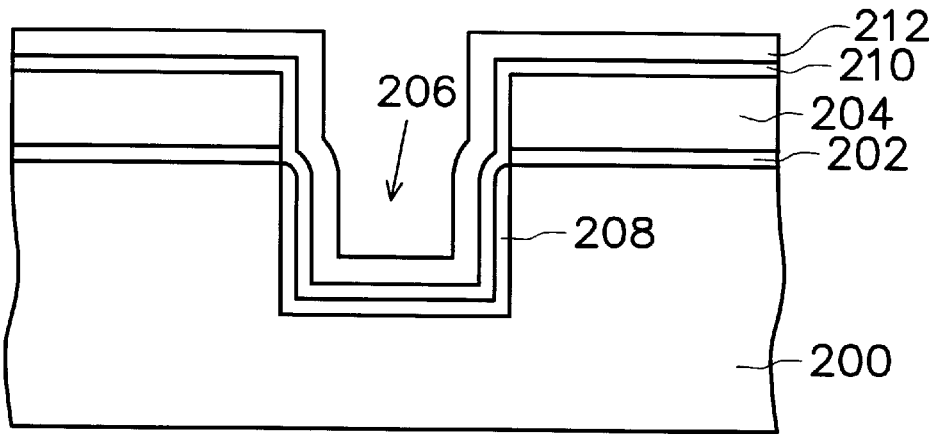

As shown in FIG. 2B, a first dielectric layer 210 conformal to the surface of the mask layer 204 and the liner oxide layer 208 is formed. The first dielectric layer 210 is formed from a material that demonstrates some hydrophobicity towards silicon oxide by chemical vapor deposition using ozone and tetra-ethy-ortho-silicate (TEOS) as the reactive gases. In this manner, in the subsequent process, silicon oxide will be deposited faster on the surface of the first dielectric layer 210 when TEOS and ozone are used as reactive gases in the deposition of silicon oxide.

Preferably, the first dielectric layer 210 is a silicon oxide layer formed by plasma enhanced chemical vapor deposition (PECVD) using, for example, silane and oxygen as the reactive gases.

A second dielectric layer 212 conformal to the surface profile of the first dielectric layer 210 is formed. The second dielectric layer 212 is formed from a material that demonstrates some hydrophilicity towards silicon oxide formed by chemical vapor deposition using ozone and TEOS as the reactive gases. In this manner, in the subsequent process, silicon oxide will be deposited more slowly on the surface of the second dielectric layer 212 when TEOS and ozone are used as reactive gases. For example, the second dielectric layer 212 can be a silicon nitride layer formed by plasma enhanced chemical vapor deposition (PECVD).

Figure 2C:
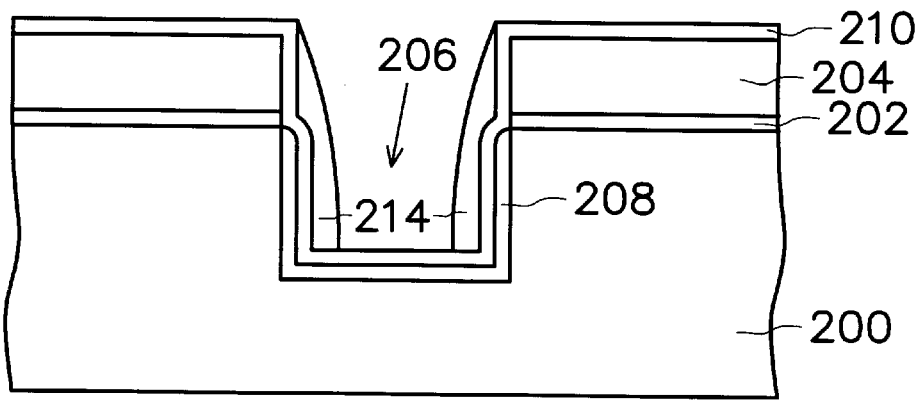

As shown in FIG. 2C, the second dielectric layer 212 is etched back using the first dielectric layer 210 as an etching stop layer. Hence, spacers 214 are formed on the sidewalls of the shallow trench while a portion of the first dielectric layer 210 at the bottom of the shallow trench 206 is exposed. The second dielectric layer 212 is etched back by, for example, reactive ion etching.

Figure 2D:
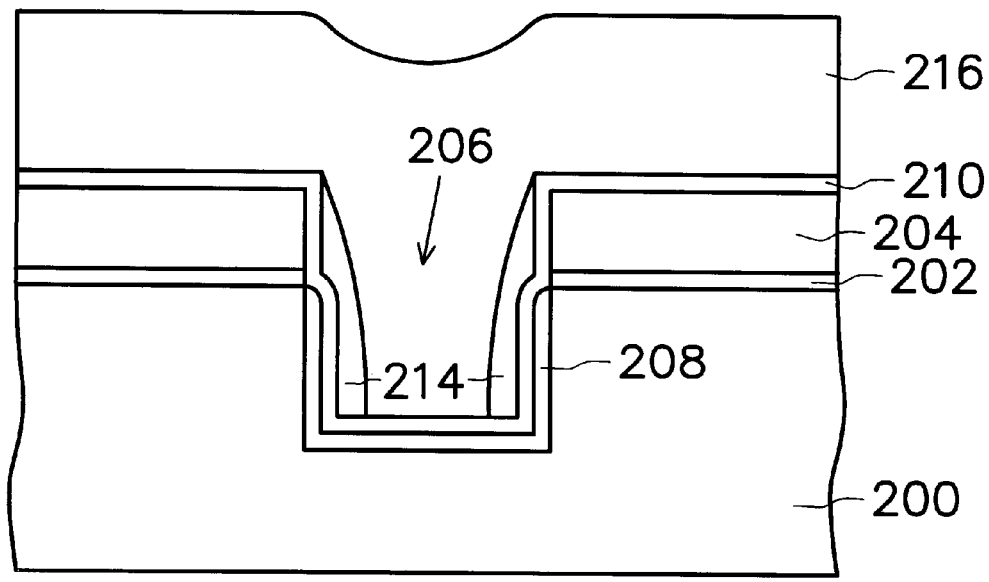

As shown in FIG. 2D, a third dielectric layer 216 preferably having a thickness of between 6000 angstroms and 15000 angstroms is formed over the first dielectric layer 210 and the spacers 214, completely filling the shallow trench 206. The third dielectric layer 216 can be a silicon oxide layer, preferably formed by chemical vapor deposition such as sub-atmospheric chemical vapor deposition (SACVD) using ozone and TEOS as reactive gases.

Due to the faster deposition rate of the third dielectric layer 216 on the hydrophobic dielectric layer 210 than on the hydrophilic spacers 214, seams or voids rarely form in the third dielectric layer 216 inside the shallow trench 206. That is, the third dielectric layer 216 is deposited faster on the first dielectric layer 210 (the bottom of the shallow trench 206) than on the spacers 214 (the sidewalls of the shallow trench 206). Therefore, the third dielectric layer 216 tends to be deposited from the bottom of the shallow trench 206 to the top of the shallow trench 206. The third dielectric layer 216 is unlikely to be deposited from the sidewall of the shallow trench 206 to the central portion of the shallow trench 206. Thus, the formations of voids or seams in the third dielectric layer 216 inside the shallow trench 206 are prevented.

Figure 2E:
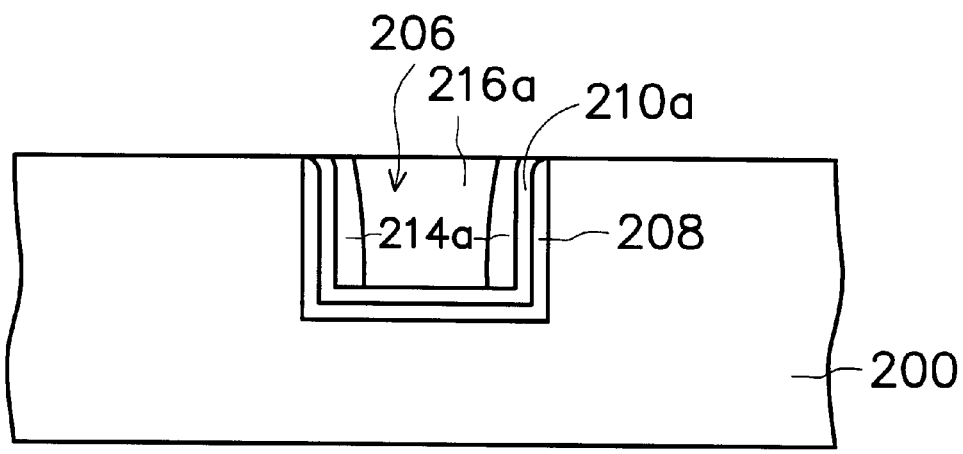

As shown in FIG. 2E, the dielectric layers 216 and 210 above the mask layer 204 is removed in a planarization process. The planarization can be carried out by, for example, chemical-mechanical polishing using the mask layer 204 as a polishing stop layer. The pad oxide layer 202 and the mask layer 204 are removed while the first dielectric layer 210 and the spacers 214 turn into a dielectric layer 210a and spacers 214a. Only a portion of the third dielectric layer 216 remains inside the shallow trench 206 and becomes a dielectric layer 216a. The pad oxide layer 202 and the mask layer 204 can be removed by, for example, wet etching.

In summary, the invention includes forming a dielectric layer over the interior surface of a shallow trench followed by forming spacers on the shallow trench sidewalls such that the dielectric layer at the bottom of the shallow trench is exposed. Due to the faster deposition rate of silicon oxide on the hydrophobic dielectric layer than the hydrophilic spacers, subsequently a silicon oxide layer (in a chemical vapor deposition using ozone and TEOS as reactive gases) is deposited at a faster rate from the bottom of the shallow trench than the sidewall of the shallow trench. Consequently, for a shallow trench having a definite aspect ratio, the silicon oxide layer inside the shallow trench is free of voids or seams.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a shallow trench isolation (STI) structure, comprising the steps of:
    providing a substrate;
    forming a pad oxide layer over the substrate;
    forming a mask layer over the pad oxide layer;
    performing a photolithographic and etching process to form a shallow trench in the substrate;
    forming a liner oxide layer on an exposed substrate surface of the shallow trench;
    forming a first dielectric layer over the mask layer and the liner oxide layer;
    forming a second dielectric layer over the first dielectric layer;
    etching back the second dielectric layer to form spacers on sidewalls of the shallow trench such that a portion of the first dielectric layer at a bottom of the shallow trench is exposed;
    forming a silicon oxide layer over the first dielectric layer and the spacers such that the shallow trench is completely filled, wherein the silicon oxide layer is formed using ozone and tetra-ethyl-ortho-silicate as reactive gases in a chemical vapor deposition, and the silicon oxide layer is deposited faster on a surface of the first dielectric layer and slower on a surface of the spacers;
    removing the silicon oxide layer and the first dielectric layer above the mask layer by performing a planarization operation;
    removing the mask layer; and
    removing the pad oxide layer.

2. The method of claim 1, wherein the mask layer includes a silicon nitride layer.

3. The method of claim 1, wherein the step of forming the first dielectric layer includes forming a silicon oxide layer by plasma-enhanced chemical vapor deposition using silane and oxygen as reactive gases.

4. The method of claim 1, wherein the second dielectric layer includes a silicon nitride layer.

5. The method of claim 1 wherein the step of etching back the second dielectric layer to form spacers includes reactive ion etching.

6. The method of claim 1, wherein the step of forming the silicon oxide layer by chemical vapor deposition includes performing a sub-atmospheric chemical vapor deposition process.

7. The method of claim 1, wherein the step of planarizing the silicon oxide layer and the first dielectric layer includes chemical-mechanical polishing.

8. A method of forming a shallow trench isolation (STI) structure, comprising the steps of:

provide a substrate;

forming a pad oxide layer over the substrate;

forming a mask layer over the pad oxide layer;

performing photolithographic and etching processes to form a shallow trench in the substrate;

forming a liner oxide layer on an exposed substrate surface of the shallow trench;

forming a first silicon oxide layer over the mask layer and the liner oxide layer using silane and oxygen as reactive gases in a plasma-enhanced chemical vapor deposition process;

forming a silicon nitride layer over the first silicon oxide layer;

etching back the silicon nitride layer to form spacers on sidewalls of the shallow trench such that a portion of the first silicon oxide layer at a bottom of the shallow trench is exposed;

forming a second silicon oxide layer over the first silicon oxide layer and the spacers such that the shallow trench is completely filled, wherein the second silicon oxide layer is formed using ozone and tetra-ethyl-ortho-silicate as reactive gases in an sub-atmospheric chemical vapor deposition, and the second silicon oxide layer is deposited faster on a surface of the first silicon oxide layer and slower on a surface of the spacers;

removing the second silicon oxide layer and the first silicon oxide layer above the mask layer by performing a planarization operation;

removing the mask layer; and removing the pad oxide layer.

9. The method of claim 8, wherein the mask layer includes a silicon nitride layer.

10. The method of claim 8 wherein the step of etching back the silicon nitride layer to form the spacers includes reactive ion etching.

11. The method of claim 8, wherein the step of planarizing the second silicon oxide layer and the first silicon oxide layer includes chemical-mechanical polishing.

* * * * *